US007852629B2

(12) United States Patent
Yu

(10) Patent No.: US 7,852,629 B2
(45) Date of Patent: Dec. 14, 2010

(54) SUSPENSION DEVICE FOR A SUPERCONDUCTING MAGNET HEAT SHIELD ENCLOSURE

(75) Inventor: Xing En Yu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/394,755

(22) Filed: Feb. 27, 2009

(65) Prior Publication Data

US 2009/0279260 A1 Nov. 12, 2009

(30) Foreign Application Priority Data

Feb. 29, 2008 (CN) .................... 2008 2 0003843 U

(51) Int. Cl.
*H05K 7/20* (2006.01)
*F25B 19/00* (2006.01)
*H01F 5/00* (2006.01)

(52) U.S. Cl. .................... 361/699; 361/707; 62/51.1; 335/300; 335/301

(58) Field of Classification Search ................. None
See application file for complete search history.

(56) References Cited

U.S. PATENT DOCUMENTS 4,622,824 A * 11/1986 Creedon ..................... 62/50.7

4,721,934 A * 1/1988 Stacy ......................... 335/300
4,837,541 A * 6/1989 Pelc ........................... 335/300
5,032,869 A * 7/1991 Herd et al. .................. 335/216

FOREIGN PATENT DOCUMENTS

JP 61115307 A 6/1986

* cited by examiner

Primary Examiner—Boris L Chervinsky
(74) Attorney, Agent, or Firm—Schiff Hardin LLP

(57) ABSTRACT

A suspension device mounts a superconducting magnet heat shield enclosure that encompasses a low-temperature container, that encompasses a superconducting magnet and holds coolant for cooling the superconducting magnet. The low-temperature container has an outer heat shield layer and an inner heat shield layer. A vacuum jacket encompasses the heat shield enclosure and has an outer vacuum shell and an inner vacuum shell. A first set of suspension parts connects the outer vacuum shell with the low-temperature container, and a second set of suspension parts connects the outer heat shield shell with the low-temperature container. Since the second set of suspension parts connect the heat shield enclosure directly with the low-temperature container, this reduces the relative movement between the two parts, thus alleviating the streaking phenomenon in a magnetic resonance image, if the superconducting magnet is part of a magnetic resonance imaging system.

6 Claims, 2 Drawing Sheets

SUSPENSION DEVICE FOR A SUPERCONDUCTING MAGNET HEAT SHIELD ENCLOSURE

BACKGROUND OF THE INVENTION

1. Field of the Invention

The present invention concerns a suspension device, and more particularly to a suspension device for a superconducting magnet heat shield enclosure which is especially suitable for MRI devices.

2. Description of the Prior Art

MRI devices have a wide range of application. MRI devices include three basic components: the magnet part, the magnetic resonance excitation and signal detection part, and the data processing and image reconstruction part. The magnet normally includes a basic field magnet for generating a stable main magnetic field and a gradient coil for generating a fast break-make gradient magnetic field. The RF device of the excitation and signal detection part transmits RF signals into the objects to be examined and receives MR signals generated thereby. These MR signals are processed by the data processing and image reconstruction part to form MR images. For example, in medical application, the images generated by the MRI device can provide accurate visual information for diagnosis and treatment of diseases.

The basic field magnet used in the MRI device can be a normal electrical magnet, a permanent magnet or a superconducting magnet. With an intense current running through, the coil made of a superconducting material (if used) generates a powerful magnetic field. The current in the superconducting coil remains unchanged even after the impressed current is cut off; therefore the superconducting magnetic field is very stable. In order to maintain the superconducting state, the superconducting magnet must be placed in a low-temperature liquid container and immersed into a coolant such as liquid nitrogen. To reduce evaporation consumption of the coolant, a heat shield enclosure is further installed in the cylinder outside the coolant. In addition, an external vacuum shell is installed outside the heat shield enclosure.

In the actual operation of the superconducting magnet, small vibrations of various components may cause relative movement between the heat shield enclosure and the magnet, which leads to generation of an eddy current in the heat shield enclosure that disturbs the homogeneity of the magnetic field and causes streaking phenomenon in the magnetic resonance image. Factors that may cause relative movement between the heat shield enclosure and the magnet include operation of the cooling head connecting to the coolant or the gradient coil to work or floor vibration, etc. Therefore, a key factor in the design of a suspension device for a heat shield enclosure is control of the relative movement between the heat shield enclosure and the magnet.

Japanese patent 61-115307 discloses a suspension system used in an MRI device. As shown in FIGS. 1 and 2 herein, the MRI device has a magnet 1, a low-temperature container 2, a heat shield enclosure and a vacuum jacket. The low-temperature container 2 that encompasses the magnet 1 cools the magnet 1. The heat shield enclosure encompassing the low-temperature container 2 has an outer heat shield layer 3a and an inner heat shield layer 3b. The vacuum jacket encompassing the heat shield enclosure also has an outer vacuum shell 4a and an inner vacuum shell 4b.

In this system, the outer vacuum shell 4a and the outer heat shield layer 3a are connected by the connecting part 8, and the outer vacuum shell 4a and the low-temperature container 2 are connected by the connecting part 9. The position of the low-temperature container 2 relative to the magnet 1 is fixed. As shown in FIG. 2, the connecting parts are uniformly and symmetrically distributed along the diameter of the magnet 1. FIG. 3 is a schematic diagram showing the structure of a connecting part 8, which is of a rigid structure.

In such a structure, since both the low-temperature container 2 and the outer heat shield layer 3a connect with the outer vacuum shell, it is not easy to control the relative position between the low-temperature container 2 and the outer heat shield layer 3a to avoid the relative movement between the magnet and the heat shield enclosure installed in the low-temperature container 2. As a result, the problem of streaking phenomenon cannot be fundamentally alleviated.

Moreover, since the connecting parts 8 between the outer vacuum shell 4a and the outer heat shield layer 3a are rigid components distributed radially along the outer heat shield layer 3a, the outer vacuum shell 4a and the outer heat shield layer 3a have a low ability to adapt to each other in the event of any vibration generated, which is not good for absorbing and reducing any relative position displacements due to such vibration.

Therefore, there is a need to provide a suspension device for the superconducting magnet heat shield enclosure that can overcome the aforementioned shortcomings.

SUMMARY OF THE INVENTION

An object of the present invention is to provide a suspension device for the superconducting magnet heat shield enclosure, which reduces the relative movement between the superconducting magnet and the heat shield enclosure, thus decreasing the streaking phenomenon generated by such movement.

Another object of the invention is to provide a suspension device with more flexible settings for the superconducting magnet heat shield enclosure so that it can enable the user to set the number and position of the suspension parts in the suspension device according to the specific work conditions.

A further object of the invention is to provide a suspension device with more flexible settings for the superconducting magnet heat shield enclosure, wherein the suspension parts shall have good strength as well as a high ability to absorb vibrations.

The above objects are achieved in accordance with the present invention by a suspension device for the superconducting magnet heat shield enclosure used in an MRI device, having a low-temperature container encompassing the superconducting magnet which holds the coolant for cooling the superconducting magnet, a heat shield enclosure encompassing the low-temperature container, which has an outer heat shield layer and an inner heat shield layer, a vacuum jacket encompassing the heat shield enclosure, which has an outer vacuum shell and an inner vacuum shell, and a first set of suspension parts and a second set of suspension parts. The first set of suspension parts connect the outer vacuum shell with the low-temperature container, and the second set of suspension parts connects the outer heat shield layer with the low-temperature container.

In an embodiment of the present invention, the first set of suspension parts has the same number of parts as the second set of suspension parts.

in another embodiment of the present invention, the first set of suspension parts has the same number of parts as the second set of suspension parts and both are distributed symmetrically along the two perpendicular diameters of the low-temperature container.

In another embodiment of the present invention, the second set of suspension parts are made of a strength-enhanced material, preferably carbon fiber reinforced polymer (CFRP), glass fiber reinforced polymer (GRP) or austenitic stainless steel.

The suspension device according to the present invention for the superconducting magnet heat shield enclosure used in the MRI device can considerably reduce the relative movement between the heat shield enclosure and the low-temperature container, thus reducing the streaking phenomenon resulting from such relative movement. Since the position displacement of an object can always be resolved into displacements in two perpendicular directions, distributing the suspension parts symmetrically along the two perpendicular diameters can significantly reduce the relative position displacement between the heat shield enclosure and the low-temperature container, making it not only more flexible to design the suspension device of the present invention for the superconducting magnet heat shield enclosure in the MRI device, but also more convenient to manufacture and install the suspension parts to reduce the manufacturing cost of the MRI device.

DESCRIPTION OF THE PREFERRED EMBODIMENTS

Figure 1:
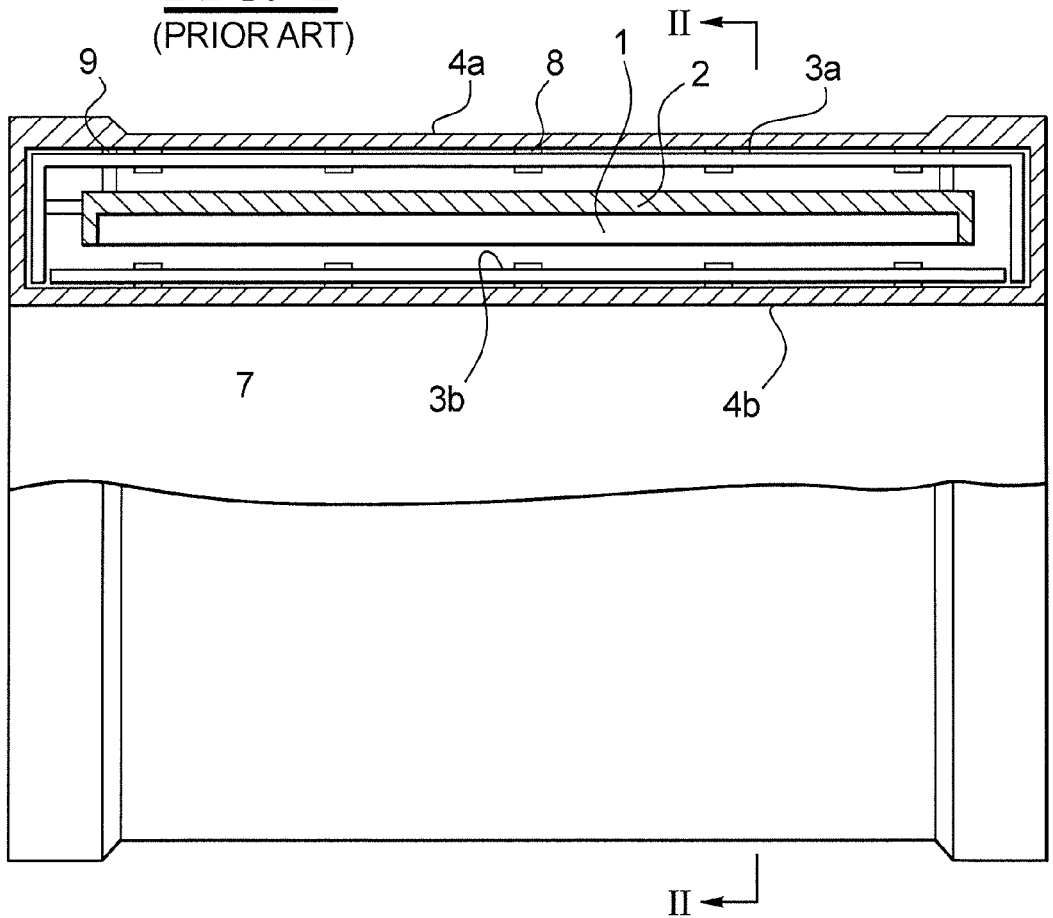
FIG. 1 is a schematic diagram showing part of the structure of the MRI device in the prior art.
Figure 2:
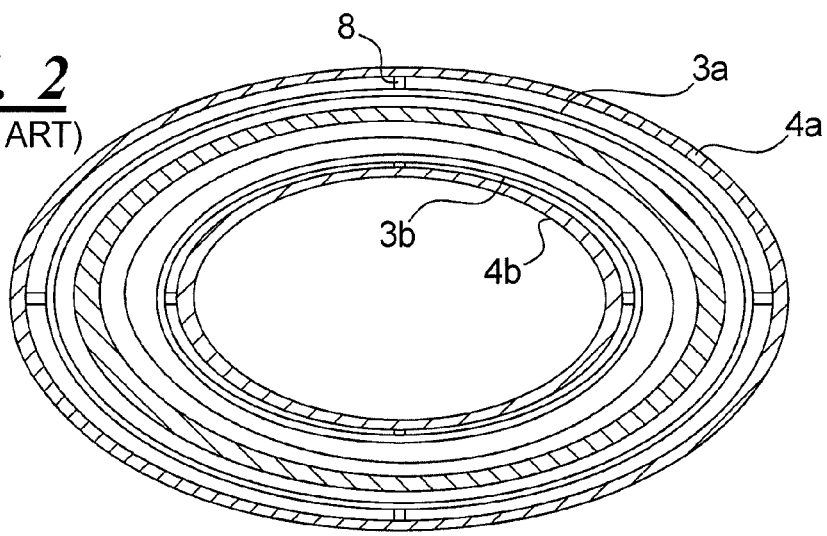
FIG. 2 is a cutaway view taken in the direction of II-II in FIG. 1.
Figure 3:
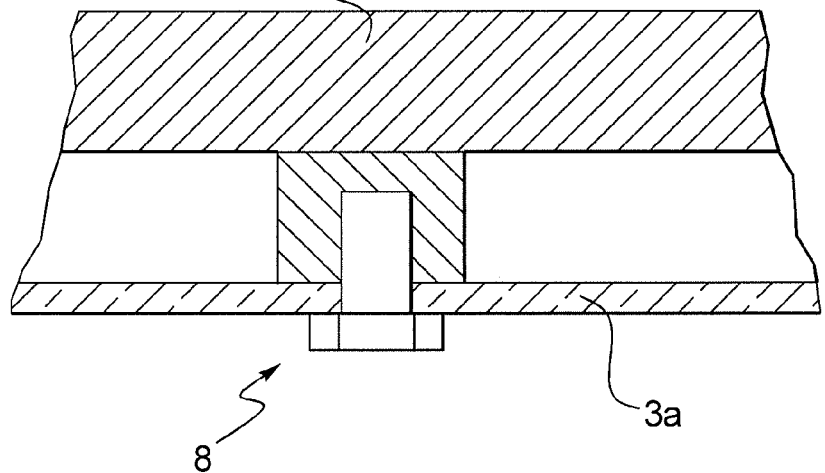
FIG. 3 is a schematic structure diagram of the connecting part between the outer vacuum shell and the outer heat shield layer in the prior art.
Figure 4:
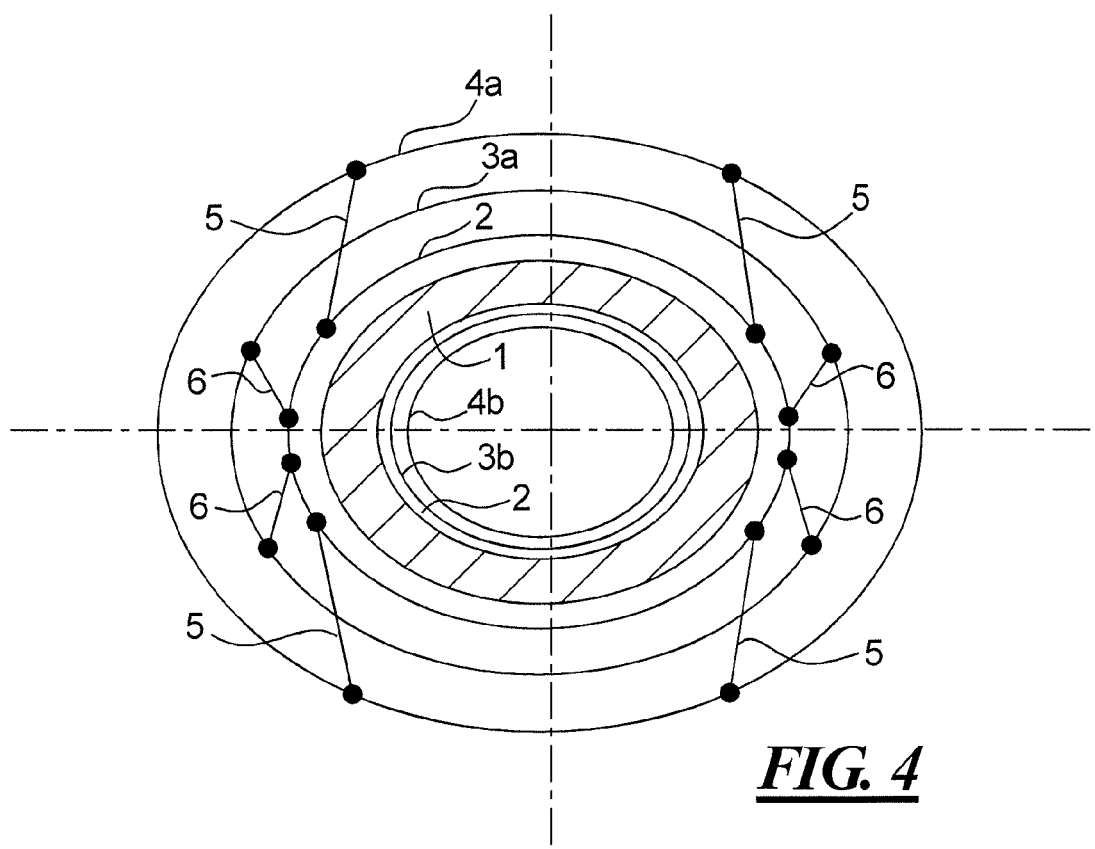
FIG. 4 is a schematic diagram showing a structure of the suspension device for the superconducting magnet heat shield enclosure according to the present invention.

FIG. 4 is a schematic diagram showing a structure of the suspension device for the superconducting magnet heat shield enclosure according to the present invention, wherein said device comprises a magnet 1, a low-temperature container 2, a heat shield enclosure and a vacuum jacket.

The low-temperature container 2 encompasses the superconducting magnet 1 to be cooled. The superconducting magnet 1 can be of the type used in an MRI system, or a superconducting magnet used in other applications. The superconducting magnet can be immersed in liquid helium contained in the low-temperature container 2. The liquid helium normally can have an ultra-low temperature of lower than 2.17K to ensure that the superconducting magnet maintains the superconducting state. Of course, those skilled in the art will understand that, if the superconducting magnet is made from a high-temperature superconducting material, the low-temperature container 2 can then contain other coolant allowing the material to maintain the superconducting properties.

The heat shield enclosure encompassing the low-temperature container 2 has an outer heat shield layer 3a and an inner heat shield layer 3b. The vacuum jacket encompassing the heat shield enclosure also has an outer vacuum shell 4a and an inner vacuum shell 4b.

The outer vacuum shell 4a and the low-temperature container 2 are connected by the first set of suspension parts 5. Those skilled in the art shall understand that the connecting positions of various suspension parts should be so that the outer vacuum shell 4a and the low-temperature container 2 can stay in a fixed and balanced position. In an embodiment according to the present invention, various parts in the first set of suspension parts 5 are distributed symmetrically along the two perpendicular diameters of the low-temperature container 2. The position displacement of an object can always be resolved into two vectors in perpendicular directions; therefore distributing the suspension parts 5 symmetrically along the two perpendicular diameters can considerably reduce the relative position displacement between the heat shield enclosure 3 and the low-temperature container 2. Moreover, from the perspective of plane stabilization, the first set of suspension parts 5 normally should have three or more parts, and in this embodiment the first suspension parts 5 have four parts.

The outer heat shield layer 3a and the low-temperature container 2 are connected by the second set of suspension parts 6. Those skilled in the art can understand that the connecting positions of various suspension parts should be so that the outer heat shield layer 3a and the low-temperature container 2 can stay in a fixed and balanced position. In an embodiment according to the invention, various parts in the second set of suspension parts 6 are also distributed symmetrically along two perpendicular diameters of low-temperature container 2. The symmetrical axes of the two sets of suspension parts can be either identical or different. In the embodiment according to the invention as shown in FIG. 4, the first set of suspension parts 5 and second set of suspension parts 6 have identical symmetrical axis (as the dotted line shown in FIG. 4). Similarly, to achieve plane stability, the second set of suspension parts 6 normally should have three or more parts, and in this embodiment, the second suspension parts 6 have four parts. In this embodiment, the first set of suspension parts 5 and the second set of suspension parts 6 have the same number of parts, but in the real-world application, the two sets of suspension parts may have a different number of parts.

In the present invention, the suspension parts may connect to the low-temperature container and the outer vacuum shell or to the low-temperature container and the outer heat shield layer by various available connecting means, for example securing screws or a securing hole.

In an embodiment according to the present invention, the second set of suspension parts 6 are made of a strength-enhanced material, preferably carbon fiber reinforced polymer (CFRP), glass fiber reinforced polymer (GRP) or austenitic stainless steel.

The action of the second set of suspension parts 6 according to the present invention enables the heat shield enclosure and the low-temperature container 2 to have a direct suspension connection between them so as to reduce the relative movement between the heat shield enclosure and the low-temperature container. As the relative position between the low-temperature container 2 and the magnet 1 is fixed, so the second set of suspension parts 6 according to the present invention can reduce the relative movement between the heat shield enclosure and the magnet 1 to alleviate the streaking phenomenon due to the relative movement between the heat shield enclosure and the magnet 1.

Moreover, since the second set of suspension parts 6 are made from a high-strength material, they can reduce the position displacement caused by vibrations and allow the suspension parts to have good strength and excellent vibration-absorbing ability.

Although modifications and changes may be suggested by those skilled in the art, it is the intention of the inventor to embody within the patent warranted hereon all changes and modifications as reasonably and properly come within the scope of his contribution to the art.

I claim:

1. A suspension device for the superconducting magnet heat shield enclosure, comprising:
   a low-temperature container encompassing a superconducting magnet, that contains coolant for cooling said superconducting magnet;
   one heat shield enclosure encompassing said low-temperature container, said one heat shield enclosure comprising an outer heat shield layer and an inner heat shield layer;
   a vacuum jacket encompassing said heat shield enclosure, said vacuum jacket comprising an outer vacuum shell and an inner vacuum shell;
   a first set of suspension parts that connect the outer vacuum shell with said low-temperature container;
   a second set of suspension parts that connect the outer heat shield layer with said low-temperature container; and
   said low temperature container having two intersecting axes that are perpendicular to each other, and said first set of suspension parts and said second set of suspension parts each being located off of, and symmetrical with respect to, each of said two intersecting axes.

2. The device as claimed in claim 1, wherein the number of parts in said first set of suspension parts is the same as that in said second set of suspension parts.

3. The device as claimed in claim 1, wherein said second set of suspension parts are made of strength-enhanced material.

4. The device as claimed in claim 3, wherein said second set of suspension parts are made of carbon fiber reinforced plastic.

5. The device as claimed in claim 3, wherein said second set of suspension parts are made of glass fiber plastic.

6. The device as claimed in claim 3, wherein said second set of suspension parts are made of austenitic stainless steel.

* * * * *